United States Patent [19]
Chou et al.

[11] Patent Number: 5,968,846
[45] Date of Patent: Oct. 19, 1999

[54] METHOD FOR REMOVING SILICON NITRIDE MATERIAL

[75] Inventors: Hsiao-Pang Chou, Hsinten; Jung-Chao Chiao; Yu-Ju Hsiung, both of Hsinchu, all of Taiwan

[73] Assignee: United Microelectronics Corp., Taiwan

[21] Appl. No.: 09/152,379

[22] Filed: Sep. 14, 1998

[30]     Foreign Application Priority Data

Aug. 19, 1998 [TW] Taiwan .................................. 87113633

[51] Int. Cl.$^6$ .................................................. H01L 21/302
[52] U.S. Cl. ............................................ 438/712; 438/724
[58] Field of Search .................................. 438/712, 714, 438/710, 724

[56]        References Cited

U.S. PATENT DOCUMENTS

| | | | |
|---|---|---|---|
| 5,053,350 | 10/1991 | Solomon | 438/210 |
| 5,294,294 | 3/1994 | Namose | 438/699 |
| 5,644,153 | 7/1997 | Keller | 257/374 |
| 5,786,276 | 7/1998 | Brooks et al. | 438/724 |

*Primary Examiner*—Benjamin Utech
*Assistant Examiner*—Bernadine Okoro
*Attorney, Agent, or Firm*—Thomas, Kayden, Horstemeyer & Risley, L.L.P.

[57]            ABSTRACT

A etchant recipe including a mixed gas of one of a $CH_xF_y$ group and CO gas is used to etch a silicon nitride layer by plasma etching so as to form a thin polymer layer to protect a silicon layer under the silicon nitride layer from overetching. Then a soft etching is performed to remove the thin polymer. The etchant recipe is, for example, used in forming a contact opening on a gate of a MOS transistor, on which a silicon nitride layer is formed.

7 Claims, 4 Drawing Sheets

METHOD FOR REMOVING SILICON NITRIDE MATERIAL

CROSS-REFERENCE TO RELATED APPLICATION

This application claims the priority benefit of Taiwan application serial no. 87113633, filed Aug. 19, 1998.

BACKGROUND OF THE INVENTION

1. Field of the Invention

This invention relates to a method of removing a silicon nitride ($Si_3N_4$) material, and more particularly to a method with an etchant recipe to remove a silicon nitride layer within a contact opening on a gate, in which the silicon nitride layer is used as a cap on the gate of a transistor.

2. Description of Related Art

Silicon nitride is a typical dielectric material widely used in semiconductor fabrication because it has a high density and strong hardness. Due its high density, silicon nitride can resist water vapor and alkaline ions, so it is commonly used to form a mask layer in a local oxidation process to pattern out a region such as an active region. It is also used to form a passivation layer to prevent mechanical damage or an oxidation on device elements from occurring. Furthermore, silicon nitride can also be used to form a side-wall and a cap on a gate of a metal oxide semiconductor (MOS) transistor.

A silicon nitride layer is usually formed by either a low pressure chemical vapor deposition (LPCVD) process or a plasma enhanced CVD (PECVD) process. The LPCVD process is performed by making use of a reaction between dichlorosilane ($SiH_2Cl_2$) gas and ammonium ($NH_3$) gas to produce silicon nitride vapor, which is then deposited. The required conditions of the reaction environment are a temperature of about 700–800° C. and a pressure of about 0.1–1 torr. Since the temperature needed for LPCVD is too high, the device elements may be damaged. An alternative process is PECVD, which needs a lower temperature of about 250–400° C. because the reaction gas is $SiH_4$ gas instead of $SiH_2Cl_2$ gas. The PECVD also produces a lower tensile stress so that it allows a formation of a thicker silicon nitride layer.

Even though silicon nitride can be used to cover device elements such as a cap and a side-wall on the gate of the MOS transistor mentioned above, it makes it difficult to form a contact opening on it by etching through the silicon nitride layer. It is especially difficult to form a contact opening in a peripheral region in a dynamic random access memory (DRAM) fabrication process, in which the distance between interconnect lines is as small as about 0.25 microns.

FIGS. 1A–1C are cross-sectional views schematically illustrating a conventional fabrication flow of a contact opening on a MOS transistor in a peripheral region of a semiconductor substrate. In FIG. 1A, a,MOS transistor with a gate 102 and two interchangeable source/drain regions 103 are formed in a peripheral region 105 on a semiconductor substrate 100. There is a side-wall 104 on each side of the gate 102 and a cap 106 on the top of the gate 102. Both the side-wall 104 and the cap 106 are made of, for example, silicon nitride. Since formation of a DRAM in a DRAM fabrication region (not shown) needs several depositions of oxide, an oxide layer 108 with a great thickness is accumulatively deposited over the substrate 100 in the peripheral region 105 of the DRAM fabrication region. In FIG. 2B, an etching process is performed to form a trench 114 to expose the cap 106 on the gate 102, in which process the etchant is a mixed plasma gas of $C_4F_8/CO/Ar/O_2$.

In FIG. 1B and FIG. 1C, a plasma etching is subsequently performed to etch out the cap 106 within the trench 114 to form a contact opening 112, which exposes the gate 102. The plasma ion gas for this PECVD process is, for example, $CF_4$, $CHF_3$, or any other gas containing fluorine.

The conventional method of removing silicon nitride, using a single recipe of fluoric gas as etchant, has a very poor effect. This is because of a poor etching selectivity. During plasma etching, the nitrogen atoms in the cap 106 and the silicon atoms in substrate 100 can form Si—N bonds, which have a strength between that of Si—O bonds and Si—Si bonds. If a single fluoric plasma gas, such as $CF_4$ or fluoroform $CHF_3$, is used as the etchant, the etching selectivity is poor. For example, the $CHF_3$ etchant has an etching selectivity of about 10 or more for silicon oxide to silicon but about 3 to 5 for silicon nitride to silicon, and about 2 to 4 for silicon nitride to silicon oxide. When the contact opening 116 is formed by etching, the opening bottom 116, which is the top of gate 102 and is usually made of polysilicon, is also etched a little. This causes an increase of contact impedance on the gate 102.

SUMMARY OF THE INVENTION

It is therefore an objective of the present invention to provide a method with an etchant recipe to remove silicon nitride so that a gate of a MOS transistor is not harmed, and the contact impedance on the gate is reduced.

In accordance with the foregoing and other objectives of the present invention, a method to remove silicon nitride provided in the invention includes an etchant recipe, which is a mixed plasma gas of one of a $CH_xF_y$ group and CO gas. The $CH_xF_y$ group includes, for example, $CH_3F$, $CH_2F_2$, $CHF_3$, or $CF_4$. A quite thick oxide layer is formed at a peripheral region on a semiconductor substrate, on which a MOS transistor has been already formed. The gate of the MOS transistor is enclosed by a silicon nitride layer, which includes a side-wall on each side of the gate and a cap on the top of the gate. A first plasma etching is performed to form a trench above the gate to expose the cap. The etchant used includes a mixed gas of $C_4F_8/CO/Ar/O_2$. Since the cap includes silicon nitride, it is not etched through. Next, a second plasma etching is continuously performed to etch the cap within the trench. The etchant used for the second plasma etching is a mixed gas of one of a $CH_xF_y$ group and CO gas. Due to a reaction between the CO gas and silicon atoms contained in the gate, a thin polymer layer is formed on the gate within the trench so as to avoid over-etching the gate. Then a third plasma soft etching is performed to gently remove the thin polymer layer by using an etchant of a mixed gas of $CH_xF_y/CO/Ar/O_2$. A contact opening to the gate therefore is formed. Contact impedance on the gate is significantly less than the contact impedance formed conventionally.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1A:
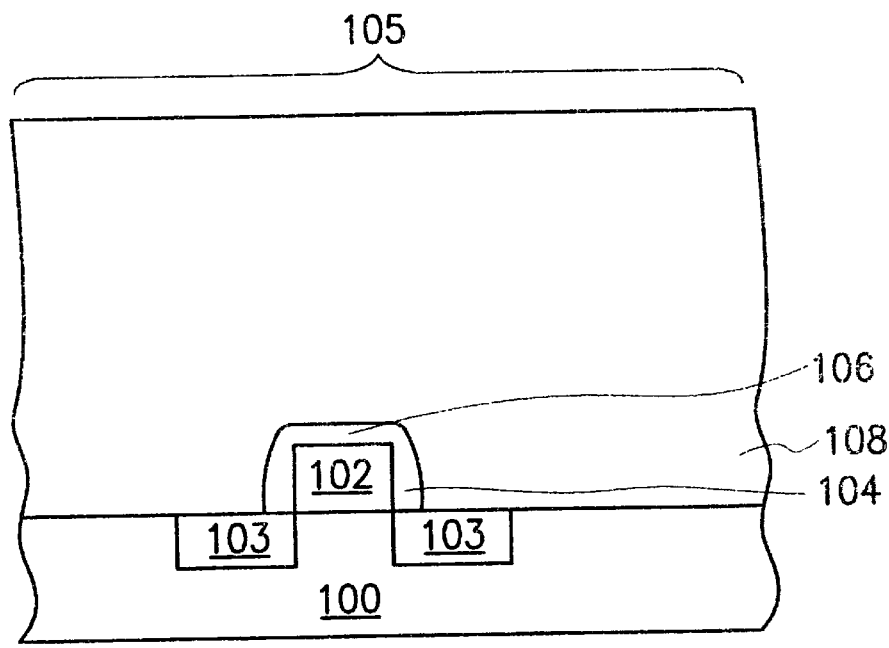
FIGS. 1A, 1B, and 1C are cross-sectional views schematically illustrating a conventional fabrication flow of a contact opening on a MOS transistor at a peripheral region of a semiconductor substrate.
Figure 1B:
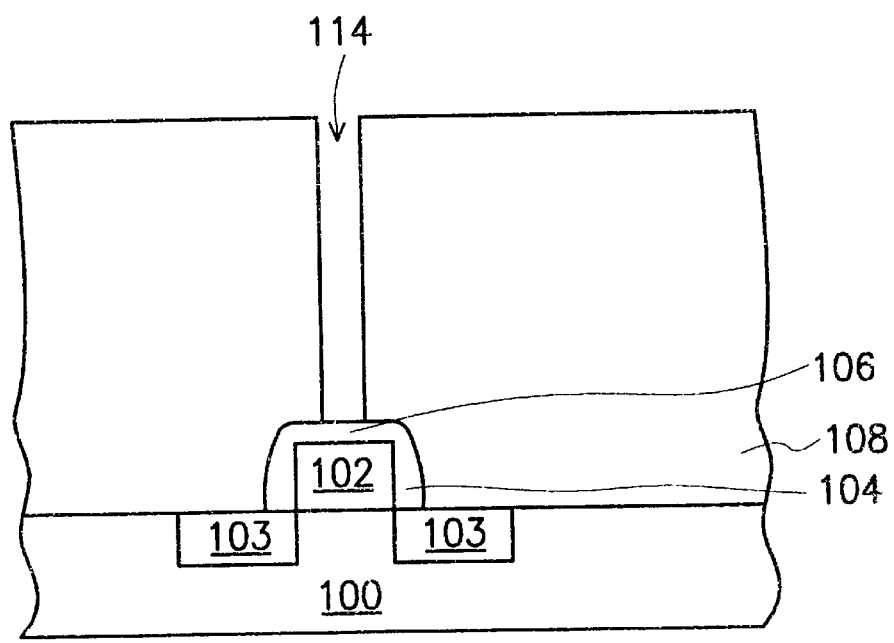
Figure 1C:
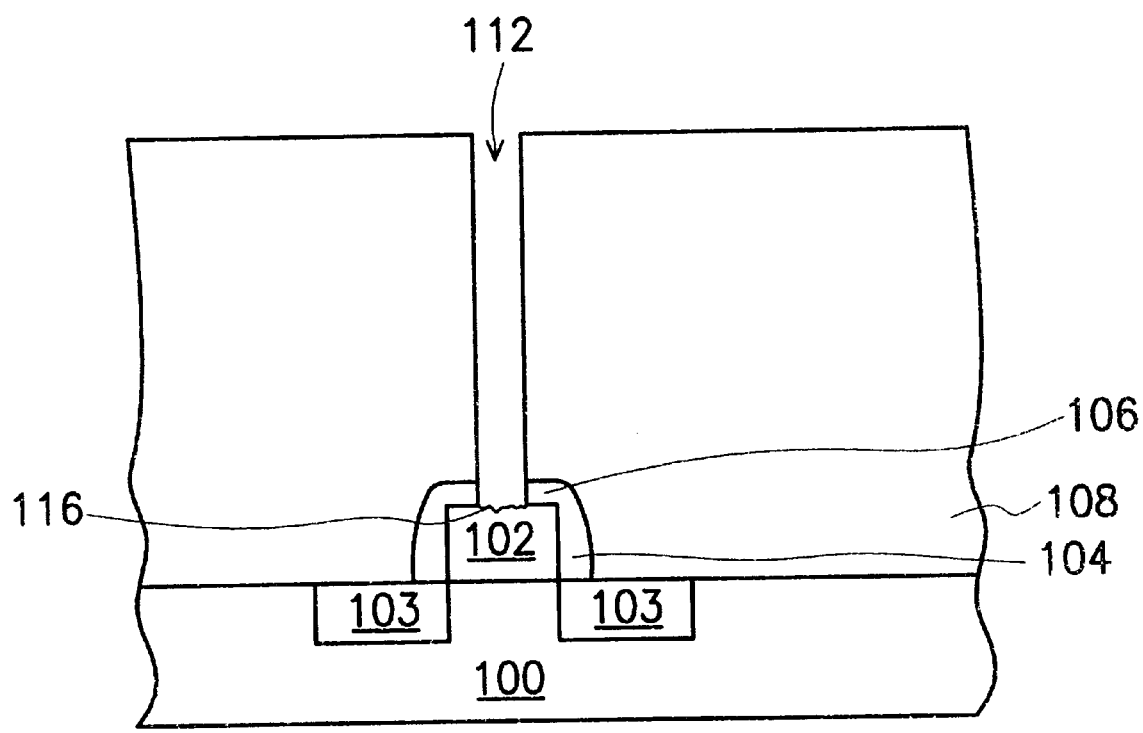
Figure 2A:
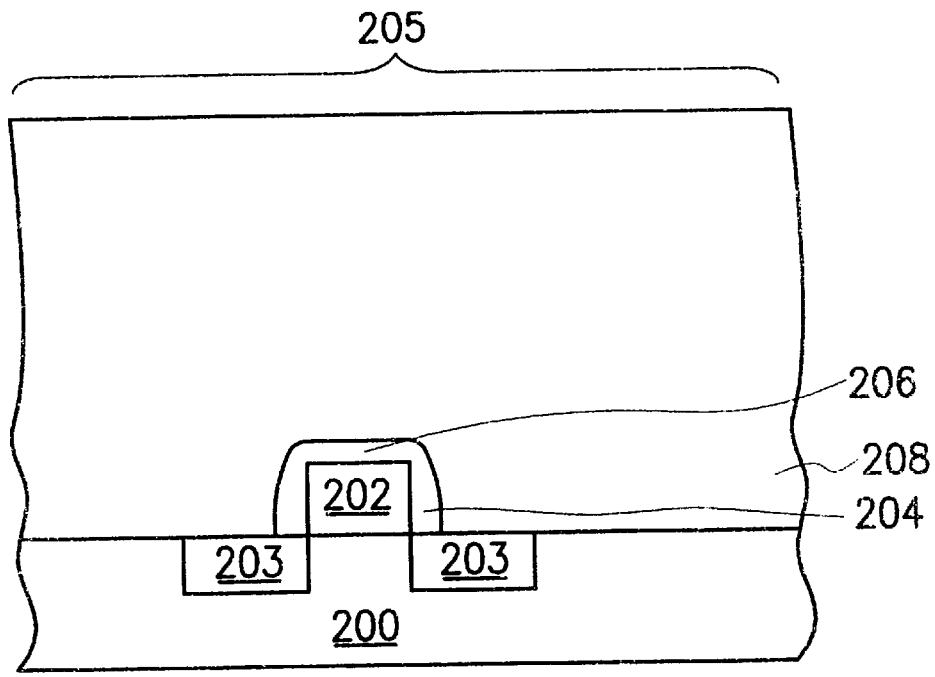
FIGS. 2A, 2B, 2C, and 2D are cross-sectional views schematically illustrating a fabrication flow of a contact opening on a MOS transistor in a peripheral region of a semiconductor substrate, according to a preferred embodiment of the invention.
Figure 2B:
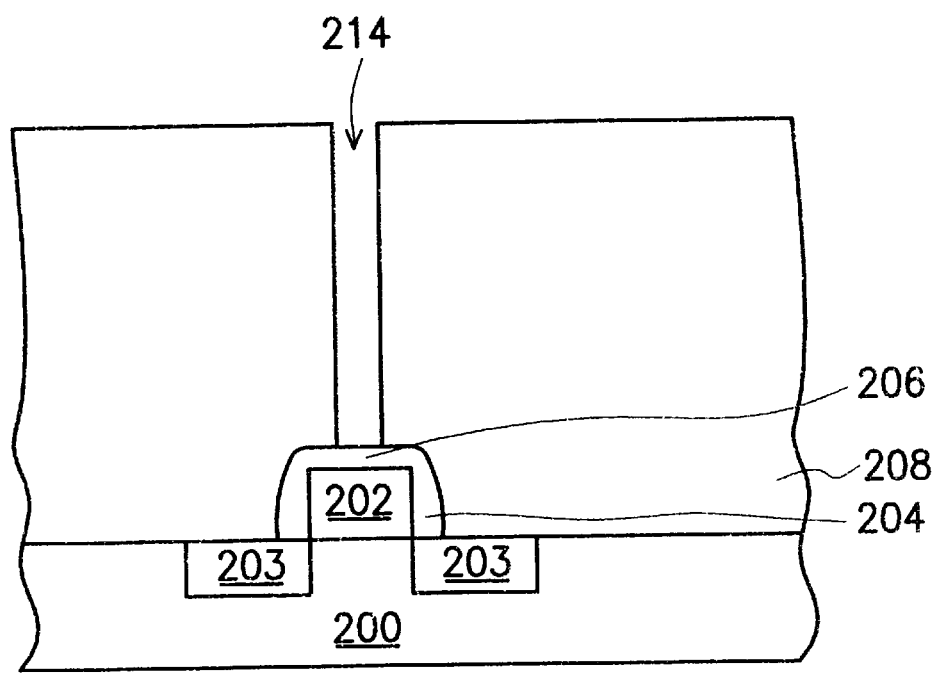

FIGS. 2A–2D are cross-sectional views schematically illustrating a fabrication flow of a contact opening on a MOS transistor at a peripheral region of a semiconductor substrate, according to a preferred embodiment of the invention. In FIG. 2A, a MOS transistor with a gate 202 and two interchangeable source/drain regions 203 are formed at a peripheral region 205 on a semiconductor substrate 200. There is a side-wall 204 on each side of the gate 202 and a cap 206 on the top of the gate 202. Both the side-wall 204 and the cap 206 are made of, for example, silicon nitride. Since formation of a DRAM in a DRAM fabrication region (not shown) needs several depositions of oxide, an oxide layer 208 with a great thickness is accumulatively deposited over the substrate 200 in the peripheral region 205 of the DRAM fabrication region. In FIG. 2B, a first etching process is performed to form a trench 214, which exposes the cap 206 on the gate 202. The etchant used is a mixed plasma gas of $C_4F_8/CO/Ar/O_2$.

Figure 2C:
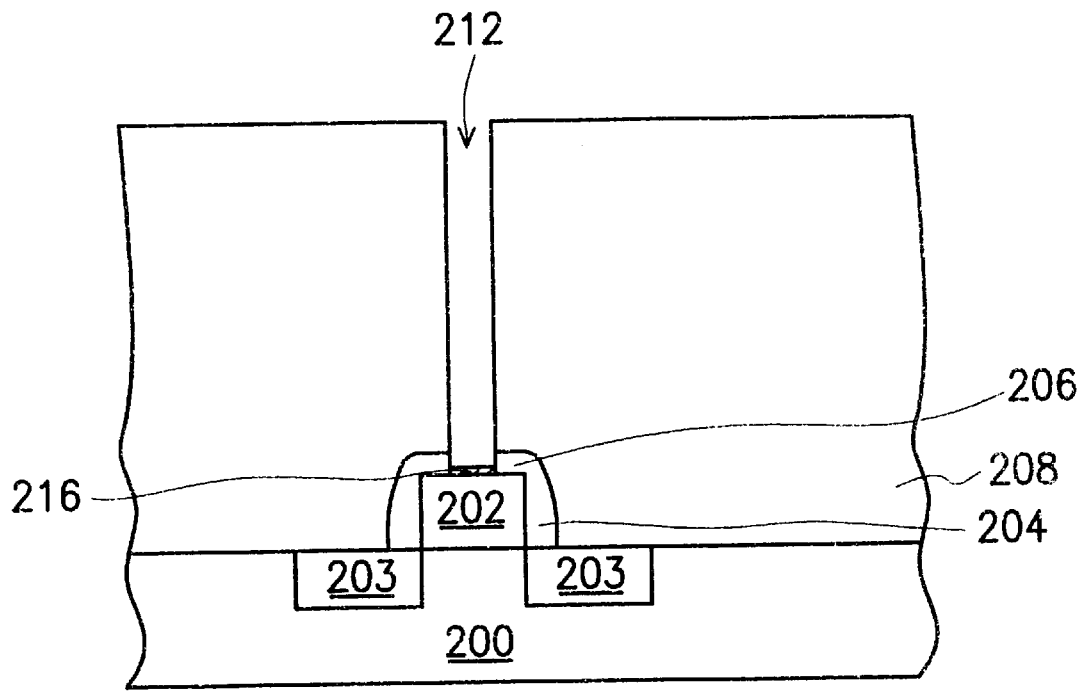

In FIG. 2B and FIG. 2C, a second plasma etching is continuously performed to etch the cap 206 within the trench 214. A contact opening 212 is thereby formed but does not yet expose the gate 202. The etchant used for the second plasma etching is a mixed gas of one of a $CH_xF_y$ group, such as $CHF_3$, and CO gas. Due to a reaction between CO gas and the silicon atoms contained in the gate 202, a thin polymer layer 216 is formed on the gate 202 within the opening 212 so as to protect the gate 202 from over-etching by the $CHF_3$ gas etchant.

Figure 2D:
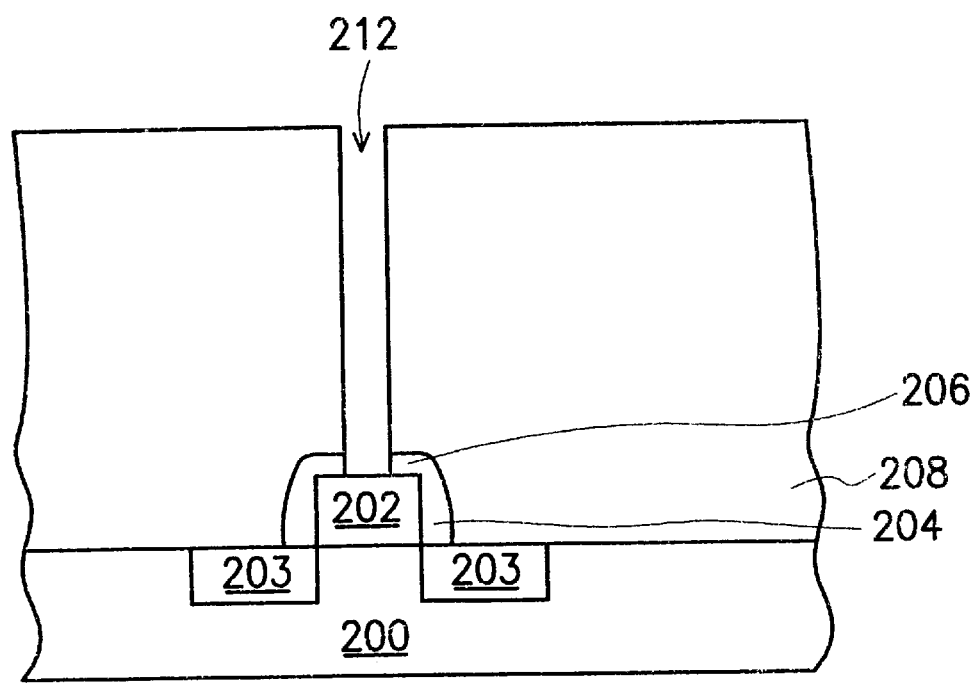

In FIG. 2D, a third plasma soft etching is performed to gently remove the thin polymer layer 216 by using an etchant of a mixed gas of $CH_xF_y/CO/Ar/O_2$. The contact opening 212 therefore is formed to expose the gate 202. A contact impedance on the gate 202 is significantly less than the contact impedance formed by the conventional method with a conventional etchant recipe. The width of the opening 212 is also smaller.

The contact opening 212 in the preferred embodiment is used for a contact on the gate 202. Actually, the etchant recipe including CO gas is suitable for any plasma etching process on the silicon nitride layer to prevent a silicon layer below the silicon nitride layer from over-etching.

In conclusion, the method with etchant recipes to remove a silicon nitride layer within a contact opening on a gate has several characteristics as follows:

1. By using a different etchant recipe in each plasma etching process, the silicon nitride within the contact opening 212 on the gate 202 can be removed without damaging the gate 202 to have a better contact on the gate 202 so that a low contact impedance on the gate 202 is achieved. The CO gas plays the main role in protecting the gate 202 because CO gas can react with Si atoms to form the thin polymer layer 216 to prevent the gate 202 from over-etching by the etchant containing fluorine. Then a soft etching is performed to gently remove the thin polymer layer without damaging the surface of the gate 202 within the contact opening 212.

2. When a contact plug is subsequently formed to fill the contact opening 212, the contact plug can have a sufficiently good contact on the gate 202. The contact impedance on the gate 202 is effectively improved. Resistance data resulting from an experiment, according to the invention, are shown in Table 1. In Table 1, With the exception of the value 1739 Ω at (L7,R8), all data shown are sufficiently low. An average of all the resistance data is only 70.83 Ω, which proves that the method of the invention can effectively reduce the contact impedance.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method of forming a contact opening on a gate of a transistor, which transistor is formed on a semiconductor substrate and includes the gate, two interchangeable source/drain regions, a side-wall on each side of the gate, and a cap on the top of the gate, wherein an oxide layer is formed over the substrate, the method comprising:

performing a first etching process with a first etchant recipe to form a trench to expose the cap of the gate;

performing a second etching process with a second etchant of a mixed gas of one of a $CH_xF_y$ group and CO gas to etch the cap of the gate within the trench so that a thin polymer layer is formed on the gate; and performing a third etching process with a third etchant to gently remove the thin polymer layer to expose the gate so that the trench becomes the contact opening.

2. The method of claim 1, wherein the first etchant comprises a mixed gas of $C_4F_8/CO/Ar/O_2$.

3. The method of claim 1, wherein the third etchant comprises a mixed gas of $CH_xF_y/CO/Ar/O_2$.

4. The method of claim 1, wherein the $CH_xF_y$ group comprises a $CF_4$ gas.

5. The method of claim 1, wherein the $CH_xF_y$ group comprises a $CHF_3$ gas.

6. The method of claim 1, wherein the $CH_xF_y$ group comprises a $CH_2F_2$ gas.

7. The method of claim 1, wherein the $CH_xF_y$ group comprises a $CH_3F$ gas.

* * * * *